United States Patent [19]

Priebe

[11] 4,362,996
[45] Dec. 7, 1982

[54] METHOD AND MEANS FOR AN ACCURATE WIDEBAND PEAK DETECTOR

[75] Inventor: Durward H. Priebe, Paso Robles, Calif.

[73] Assignee: Hewlett-Packard Company, Palo Alto, Calif.

[21] Appl. No.: 205,401

[22] Filed: Nov. 10, 1980

[51] Int. Cl.³ .............................................. G01R 19/04
[52] U.S. Cl. .................................. 328/151; 307/351; 307/358; 328/117
[58] Field of Search .................. 307/351, 358, 261; 328/117, 151

[56] References Cited

U.S. PATENT DOCUMENTS

| | | | |
|---|---|---|---|
| 3,508,158 | 4/1970 | Marchese | 307/351 |
| 3,543,050 | 11/1970 | Paine | 307/351 |
| 3,885,168 | 5/1975 | Matsuzaki | 307/351 |
| 4,295,099 | 10/1981 | Evans | 307/351 |

*Primary Examiner*—John Zazworsky
*Attorney, Agent, or Firm*—Edward Y. Wong

[57] ABSTRACT

A peak detector is comprised of two related circuits having similar circuit parameters, each providing an output in response to a repetitive waveform applied to the detector. The two outputs are combined to eliminate the dependence on the circuit parameters to provide as an output of the detector an accurate, wideband peak voltage of the applied waveform.

5 Claims, 6 Drawing Figures

METHOD AND MEANS FOR AN ACCURATE WIDEBAND PEAK DETECTOR

BACKGROUND OF THE INVENTION

For instrument applications such as universal counters and oscilloscopes, a peak detector for repetitive waveforms is a valuable addition to the various input channels. It can provide a means for automatic triggering, signal amplitude measurement, and other waveform parameter measurements such as risetime. To be adequate for this application, the peak detector must exhibit good accuracy over a wide input dynamic range and over the instrument's entire operational frequency range. Furthermore, it must also exhibit good accuracy with any arbitrary input waveshape. Good accuracy in this case means the output detected voltage must be a DC level within a few millivolts of the input peak level.

Peak detectors in the prior art cover a variety of circuits with different operational characteristics. For example, there are detectors for amplitude modulation (AM), that is, envelope detectors, and detectors for detecting and holding the amplitude of a single pulse indefinitely. Input waveforms and the corresponding detected output waveforms for these prior art detectors are illustrated in FIGS. 1A and 1B.

The AM detector for the waveform in FIG. 1A is common and simple; it typically comprises only three elements: a diode for a unidirectional flow of current; a capacitor for storing the peak amplitude; and a resistor for discharging the capacitor. This circuit is shown in FIG. 1D. This type of detector is normally designed for use only with one carrier frequency where its output must decay fast enough to follow the lower modulating frequency to develop the modulating envelope. Further, the input waveshape for this type of detector is known and is usually a sinusoid of fixed frequency. Because of the diode in series with the input, there is always a difference of approximately 0.6 volt between the input and output voltages caused by the forward voltage drop of the diode. But, since only the envelope information is desired, the fact that at the peaks the input differs from the output by this forward voltage drop of the diode ($[V_F]_{pk}$) has no significance. This would not be the case if this type of detector is used for wideband applications. There, the presence of the forward voltage drop of the diode, the fast decay for the circuit to function properly at low frequencies, and the dependence on input waveshape would make this type of detector unsuitable for wideband applications.

The detector used for short pulses is generally designed to achieve an accurate peak output voltage reflecting the peak input voltage. Further, it is designed to hold the peak voltage for a relatively long time. A typical circuit of this type of detector is shown in FIG. 1C. This type of circuit generally has no inherent output decay to allow the output to follow a slowly decreasing input amplitude. This can be seen in the input and output waveforms in FIG. 1B. Although nominally wideband in nature, because it detects pulses, the upper frequency limit to these circuits is only a few megahertz. Therefore, this type of detector is also not suitable for wideband, repetitive waveform detection. It does, however, have the accuracy lacking in the detectors, because of the typical inclusion of the diode in the voltage follower feedback loop. One can take advantage of this fact and add an element, e.g., a resistor or a current sink, to slowly discharge the storage capacitor to provide the desirable output decay. To extend the circuit to high frequency performance beyond a few megahertz, however, requires a high gain feedback amplifier with extreme bandwidth and stability beyond the input frequency range. This is extremely difficult and costly to achieve.

SUMMARY OF THE INVENTION

That the output differs from the input by one forward diode voltage drop at peak amplitude is a fundamental disadvantage of the AM detector for accurate wideband application. That is, $$V_{OUT} = [V_{IN} - V_F]_{pk}$$

If the forward drop is precisely know, then by adding it to $V_{OUT}$, one can obtain the peak value of $V_{IN}$, or $[V_{IN}]_{pk}$. To find the peak value for the diode forward voltage $[V_F]_{pk}$, however, is not trivial. It varies with the peak diode current, which, in turn, depends on the input waveshape. For instance, low duty cycle pulses and triangle waveforms result in a high forward voltage $V_F$ due to the peak occurring for a brief portion of the input period. In contrast, square waves result in low forward voltage $V_F$, because half of the input is at the peak voltage level. However, the peak detector according to the present invention generates two DC voltages that differ by $[V_F]_{pk}$; it then takes the difference between these voltages and recombines them with an operational amplifier to arrive at an accurate peak voltage output independent of the diode forward drop. In the preferred embodiment, two diode detector circuits are used to provide the two DC voltages. By making the diodes substantially identical in the two circuits, the peak DC levels derived from each of the two circuits can be made to have a related dependence on the diode forward voltage parameter. The two DC levels, then, can cancel out the related diode forward voltage parameter to provide the accurate peak voltage output required.

DESCRIPTION OF THE DRAWINGS

FIG. 1C shows a circuit for the detector having the input-output relationship of FIG. 1B.

FIG. 1D shows a circuit for the detector having the input-output relationship of FIG. 1A.

DETAILED DESCRIPTION OF THE INVENTION

Figure 1A:
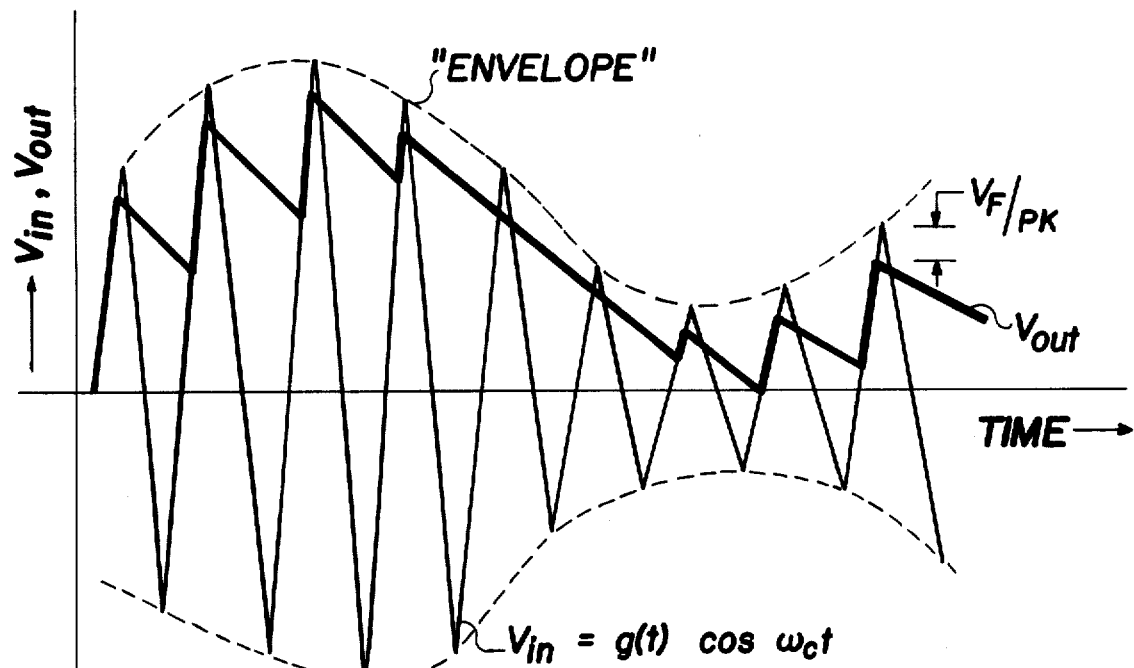
FIG. 1A shows the relationship between the input and output waveforms to the amplitude modulation (AM) detector in the prior art.
Figure 1B:
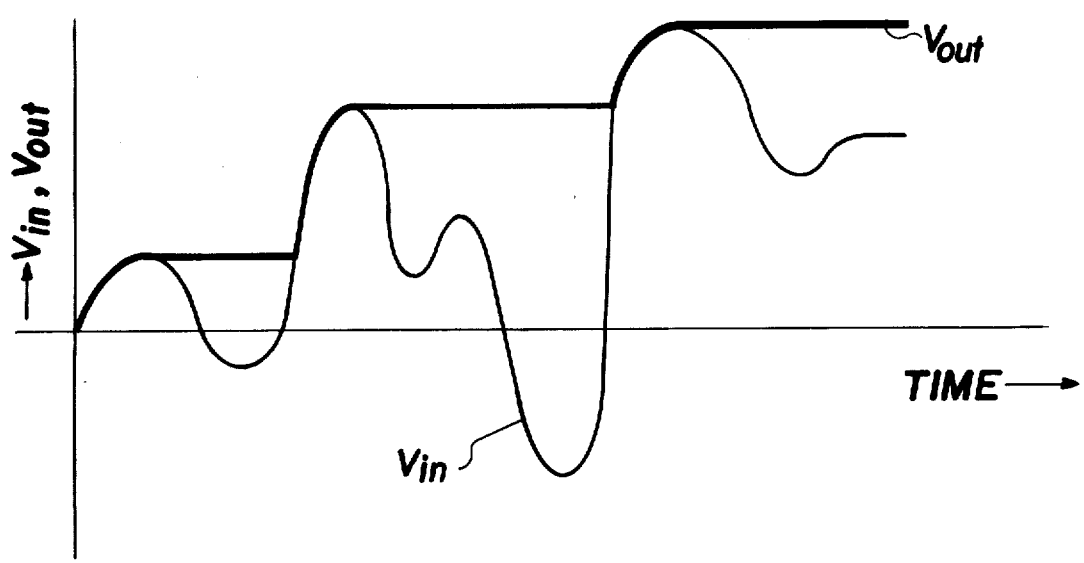
FIG. 1B shows the relationship between the input and output waveforms to a detector circuit having an infinite hold capacity in the prior art.
Figure 2:
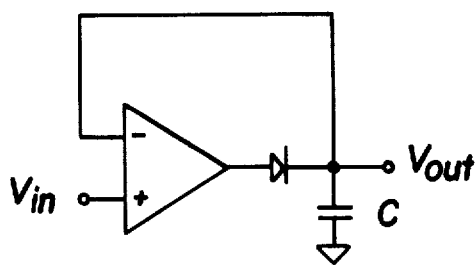
FIG. 2 shows a circuit having two peak detectors to provide two DC levels in accordance with the present invention.
Figure 2:
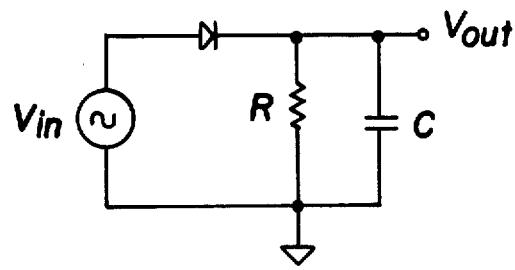
Figure 2:
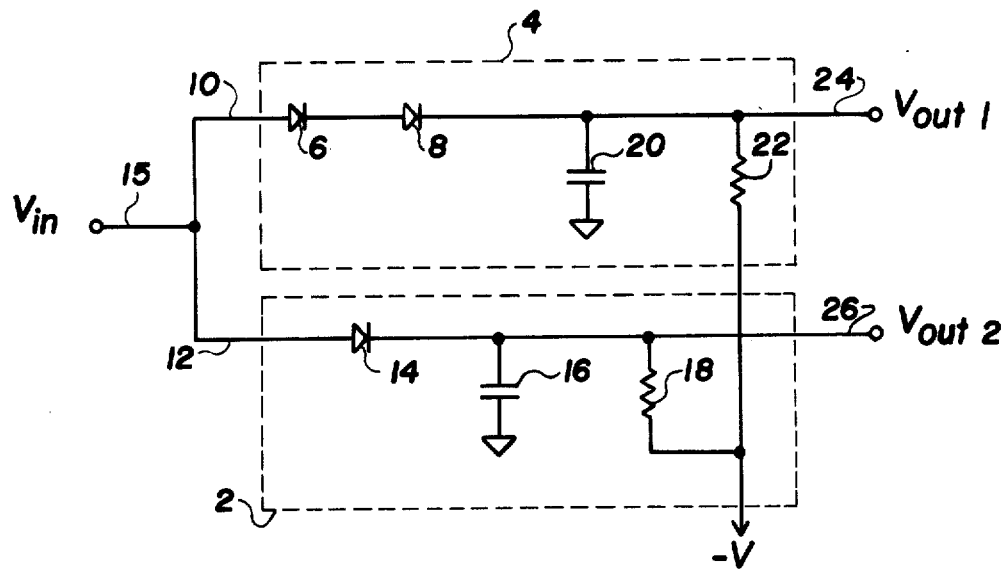
Figure 3:
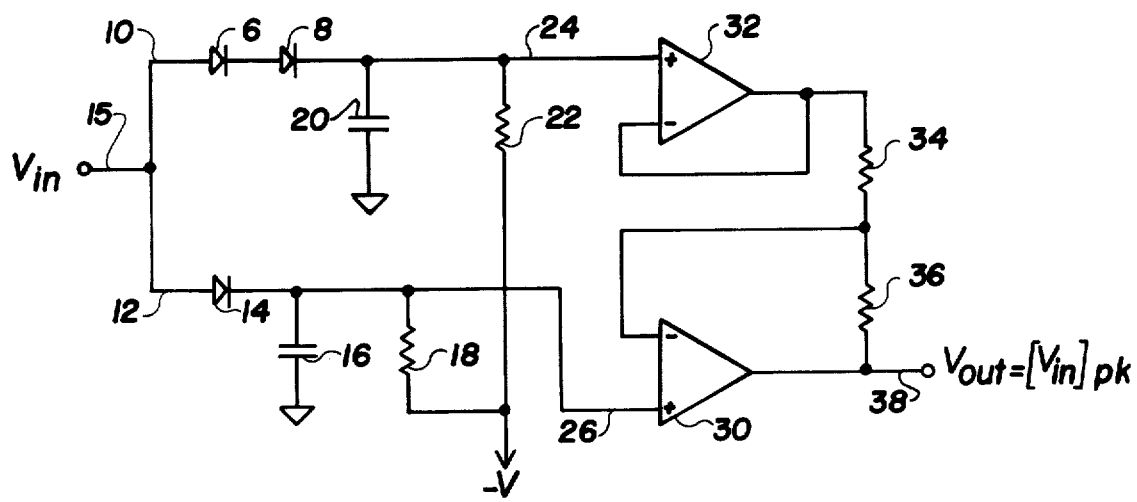
FIG. 3 shows the preferred embodiment of the peak detector in accordance with the present invention.

The technique in accordance with the present invention measures the forward voltage drop of the diode ($V_F$) at the peak and uses it to calculate the correct peak voltage as the output. Two AM-type detectors 2 and 4 are employed, one 2 being of the conventional three-element design comprising one diode 14 in series with a capacitor 16 and a resistor 18 in parallel and the other 4 having two diodes 6 and 8 instead of one in series with a capacitor 20 and a resistor 22 in parallel, the capacitors 16, 20 and resistors 18, 22 both being tied to some voltage level, ground and $-V$ respectively in the present example. As shown in FIG. 2, both detector inputs 10 and 12 are connected together to an input port 15 where an input waveform is applied. If the values of the capacitors 16 and 20 and resistors 18 and 22 are large enough, a slow decay rate results. The outputs 24 and 26 to the circuit in FIG. 2 then are:

$$V_{OUT1} = [V_{IN}]_{pk} - [V_{FD1}]_{pk} - [V_{FD2}]_{pk}, \text{ and}$$

$$V_{OUT2} = [V_{IN}]_{pk} - [V_{FD3}]_{pk},$$

where the brackets $[\ ]_{pk}$ indicate the peak value of the enclosed quantity, that is, $[V_{FD1}]_{pk}$, $[V_{FD2}]_{pk}$, and $[V_{FD3}]_{pk}$ are the peak forward voltages of diodes 6, 8, and 14, respectively, and $[V_{IN}]_{pk}$ is the peak input amplitude. With these two outputs 24 and 26 being essentially DC levels, their difference is $-[V_{FD1}]_{pk} - [V_{FD2}]_{pk} + [V_{FD3}]_{pk}$. Using diodes with matched forward voltages, this difference becomes $[V_{FD3}]_{pk}$. Now, if this difference is added to $V_{OUT2}$, the value for $[V_{IN}]_{pk}$ results. This can be accomplished with the preferred embodiment shown in FIG. 3. For accuracy and simplicity, a single operational amplifier 30 is used to achieve this result. An operational amplifier 32 operates as a voltage follower (unity gain) to buffer current through a resistor 34 to amplifier 30 away from resistor 22. Amplifier 30, in addition to subtracting output 26 from output 24, also buffers the output current and the currents through output resistors 34 and 36 away from resistor 18. It also provides a gain of two to its input 26, thus providing essentially a multiple of two of its input 26 less the diode forward drop. If resistors 34 and 36 are made equal, it performs the arithmetic operation of $V_{OUT} = 2V_{OUT2} - V_{OUT1}$. Hence, from the circuit of FIG. 3, it follows that $$\begin{aligned} V_{OUT} &= 2V_{OUT2} - V_{OUT1} \\ &= 2[V_{IN} - V_{FD3}]_{pk} - [V_{IN} - 2V_{FD3}]_{pk} \\ &= 2[V_{IN}]_{pk} - 2[V_{FD3}]_{pk} - [V_{IN}]_{pk} + 2[V_{FD3}]_{pk}; \\ V_{OUT} &= [V_{IN}]_{pk}. \end{aligned}$$

Since only the diodes 6, 8, and 14 experience the input frequency range, the frequency response of the peak detector is limited predominantly by diode switching performance, which incidentally is very good for Schottky diodes. This technique may be implemented with discrete components, or with components integrated on a chip. Matched components are necessary for good accuracy. Capacitors 16 and 20 are made to match so that the computed value for $[V_F]_{pk}$ is accurate. Input loading is small; it is the diode capacitances in parallel with the low value capacitor that discharge currents into resistors 34 and 36. The output voltage at the output port 38 may require a number of input cycles to reach full peak value, but this is of little consequence for repetitive input waveforms. Furthermore, power required of the input signal at input port 15 can be negligibly small since it is only that drawn by the two discharge resistors 18 and 22.

By making the discharge resistors 18 and 22 different values, two further benefits result. Owing to the action of the subtracting operational amplifier 30, the output decay rate equals $$2d(V_{OUT2})/dt - d(V_{OUT1})/dt.$$

Hence, the output decay can be made slower than the capacitive decays. This means a smaller capacitor value may be used to arrive at a suitable output decay. This results in a desirable initial slow drop which extends operation to low frequencies, and then a fast decay a short time later, thus allowing the detector to adapt quickly to a new lower peak amplitude input signal.

I claim:
1. An apparatus for providing the peak amplitude of a waveform applied thereto comprising:
   (a) first detector means having an input port for receiving said waveform coupled thereto for detecting the peak amplitude of said waveform and for providing a first amplitude signal representing a first amplitude of said waveform at an output port;
   (b) second detector means having an input port for receiving said waveform coupled thereto for detecting the peak amplitude of said waveform and for providing a second amplitude signal representing a second amplitude of said waveform at an output port; and
   (c) differential amplifier having first and second input ports coupled to the output port of said first and second detector means, respectively, to provide an output signal at an output port representative of the difference between said first amplitude signal and a multiple of said second amplitude signal to indicate a substantially peak amplitude of said waveform.

2. The apparatus as in claim 1 further comprising a buffer amplifier having an input port coupled to said first detector means output port and an output port coupled to said differential amplifier first input port to provide isolation between said first detector means and said differential amplifier.

3. The apparatus as in claim 1 wherein:
   said first detector means includes:
      a first diode having a first polarity end coupled to said input port;
      a second diode having a first polarity end coupled to a second polarity end of said first diode;
      a capacitor having a first end coupled to a second polarity end of said second diode and a second end coupled to a first voltage level;
      a resistor having a first end coupled to a second polarity end of said second diode and a second end coupled to a second voltage level; and
      an output port coupled to the junction of said second polarity end of said second diode, said capacitor first end, and said resistor first end to provide said first amplitude signal; and
   said second detector means includes:
      a diode having a first polarity end coupled to said input port;
      a capacitor having a first end coupled to a second polarity end of said diode and a second end coupled to a first voltage level;
      a resistor having a first end coupled to said second polarity end of said diode and a second end coupled to a second voltage level; and
      an output port coupled to the junction of said second polarity end of said diode, said capacitor first end, and said resistor first end of said second detector means to provide a second amplitude signal.

4. The apparatus as in claim 3 further comprising a buffer amplifier having an input port coupled to said first detector means output port and an output port coupled to said differential amplifier first input port to provide isolation between said first detector means and said differential amplifier.

5. A means for providing the peak amplitude of a waveform comprising the steps of:
 detecting the amplitude of the waveform with a first detector;
 detecting the amplitude of the waveform with a second detector; and
 subtracting the detected amplitude from said first detector from a multiple of the detected amplitude from said second detector to provide the peak amplitude of said waveform.

* * * * *